(12) United States Patent
Adkisson et al.

(10) Patent No.: US 8,647,913 B2
(45) Date of Patent: Feb. 11, 2014

(54) IMAGE SENSOR, METHOD AND DESIGN STRUCTURE INCLUDING NON-PLANAR REFLECTOR

(75) Inventors: James William Adkisson, Jericho, VT (US); Jeffrey Peter Gambino, Westford, VT (US); Robert Kenneth Leidy, Burlington, VT (US); John J. Ellis-Monaghan, Grand Isle, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/614,210

(22) Filed: Sep. 13, 2012

(65) Prior Publication Data

US 2013/0001727 A1 Jan. 3, 2013

Related U.S. Application Data

(62) Division of application No. 12/550,640, filed on Aug. 31, 2009, now Pat. No. 8,299,554.

(51) Int. Cl.
*H01L 27/00* (2006.01)

(52) U.S. Cl.
USPC ............................. 438/69; 257/431; 257/432

(58) Field of Classification Search
USPC .................................. 257/431, 432, E31.127
See application file for complete search history.

(56) References Cited

U.S. PATENT DOCUMENTS

| | | | |
|---|---|---|---|
| 6,465,786 B1 | 10/2002 | Rhodes | |
| 7,124,999 B1 | 10/2006 | Lai | |
| 7,279,764 B2 | 10/2007 | Mouli | |
| 7,755,123 B2 * | 7/2010 | Dungan et al. | ................ 257/294 |
| 2002/0020846 A1 | 2/2002 | Pi et al. | |
| 2007/0152289 A1 | 7/2007 | Morse et al. | |
| 2007/0194397 A1 | 8/2007 | Adkisson et al. | |
| 2009/0050947 A1 | 2/2009 | Dungan et al. | |
| 2009/0194671 A1 | 8/2009 | Nozaki et al. | |

* cited by examiner

*Primary Examiner* — Zandra Smith
*Assistant Examiner* — Paul Patton
(74) *Attorney, Agent, or Firm* — Scully, Scott, Murphy & Presser, P.C.; Richard M. Kotulak, Esq.

(57) ABSTRACT

A solid state image sensor, a method for fabricating the solid state image sensor and a design structure for fabricating the solid state image sensor structure include a substrate that in turn includes a photosensitive region. Also included within solid state image sensor is a non-planar reflector layer located over a side of the photosensitive region and the substrate opposite an incoming radiation side of the photosensitive region and the substrate. The non-planar reflector layer is shaped and positioned to reflect uncaptured incident radiation back into the photosensitive region while avoiding optical cross-talk with an additional photosensitive region laterally separated within the substrate.

13 Claims, 6 Drawing Sheets

IMAGE SENSOR, METHOD AND DESIGN STRUCTURE INCLUDING NON-PLANAR REFLECTOR

CROSS REFERENCE TO RELATED APPLICATION

This application is a divisional of U.S. patent application Ser. No. 12/550,640, filed Aug. 31, 2009, the entire content and disclosure of which is incorporated herein by reference.

BACKGROUND

1. Field of the Invention

The invention relates generally to image sensors, methods for fabrication thereof and design structures for fabrication thereof. More particularly, the invention relates to image sensors with enhanced light capture.

2. Description of the Related Art

Solid state image sensors are popular optoelectronic components that find use in various imaging technology applications. Particularly common are solid state image sensors that are used as active light capture and imaging elements within digital cameras.

Solid state image sensors may be fabricated using any of several semiconductor technologies for the active light capture and imaging elements. Charge coupled devices are known as more traditional solid state image sensor light capture and imaging elements. Complementary metal oxide semiconductor (CMOS) devices provide yet another semiconductor based active light capture and imaging element for use within a solid state image sensor. Solid state image sensors predicated upon CMOS semiconductor devices are generally more desirable insofar as such CMOS based solid state image sensors typically consume less power in comparison with other types of solid state image sensors.

While solid state image sensors in general, and CMOS image sensors more particularly, are desirable within the optoelectronic component fabrication art, solid state image sensors in general; and CMOS image sensors more particularly, are not entirely without problems. In particular, light capture efficiency and light conversion efficiency are often relevant parameters that may be difficult to optimize within solid state image sensors. To that end, solid state image sensor designs that include superior light capture efficiency and/or superior light conversion efficiency are desirable.

Various solid state image sensor structures and designs, and methods for fabrication thereof, are known in the optoelectronic art.

For example, Pi et al., in U.S. Pub. No. 2002/0020846, teaches a backside illuminated photodiode array that may be used within the context of a solid state image sensor. The backside illuminated photodiode array may be coupled with a scintillation material to provide a scintillation based backside illuminated photodiode array.

In addition, Rhodes, in U.S. Pat. No. 6,465,786, teaches a deep infrared photodiode that may be used within a CMOS image sensor. The deep infrared photodiode includes an infrared absorptive silicide layer, as well as an optional reflective layer.

Finally, Mouli, in U.S. Pat. No. 7,279,764, teaches a CMOS image sensor that includes a silicon based resonant cavity. The silicon based resonant cavity provides an increased light absorption for the CMOS image sensor at long wavelengths.

Solid state image sensors, including in particular CMOS image sensors, are likely to be of continued interest and continued importance as solid state image sensor technology advances. Thus, desirable are solid state image sensors, and methods for fabrication thereof, that provide for accurate and efficient light capture and light conversion.

SUMMARY

The invention provides a solid state image sensor, a method for fabricating the solid state image sensor and a design structure for fabricating the solid state image sensor. The solid state image sensor, which is typically but not necessarily a CMOS image sensor that is a backside solid state image sensor, includes a non-planar, and typically curved, reflective layer intended to optimize light capture, and therefore light conversion, within the solid state image sensor.

A particular solid state image sensor in accordance with the invention includes a substrate including a photosensitive region. This particular solid state image sensor also includes a non-planar reflector layer located at (or over) a side of the photosensitive region opposite an incident radiation side of the photosensitive region. The non-planar reflector layer is shaped and positioned to reflect uncaptured incident radiation back into the photosensitive region.

Another particular solid state image sensor in accordance with the invention also includes a substrate including a photosensitive region. This other particular solid state image sensor includes a non-planar reflector layer located within a dielectric isolated metallization stack located at (or over) a side of the photosensitive region opposite an incident radiation side of the photosensitive region. The non-planar reflector layer is shaped and positioned to reflect uncaptured incident radiation back into the photosensitive region.

A particular method for fabricating a solid state image sensor in accordance with the invention includes providing a substrate including a photosensitive region. This particular method also includes forming over a side of the photosensitive region opposite an incoming radiation side of the photosensitive region a non-planar reflector layer. The non-planar reflector layer is shaped and positioned to reflect uncaptured incident radiation back into the photosensitive region.

BRIEF DESCRIPTION OF THE DRAWINGS

The objects, features and advantages of the invention are understood within the context of the Description of the Preferred Embodiment, as set forth below. The Description of the Preferred Embodiment is understood within the context of the accompanying drawings, that form a material part of this disclosure, wherein.

DETAILED DESCRIPTION

The invention, which includes a solid state image sensor and a method for fabricating the solid state image sensor, is understood within the context of the description set forth below. The description set forth below is understood within the context of the drawings described above. Since the drawings are intended for illustrative purposes, the drawings are not necessarily drawn to scale.

Figure 1:
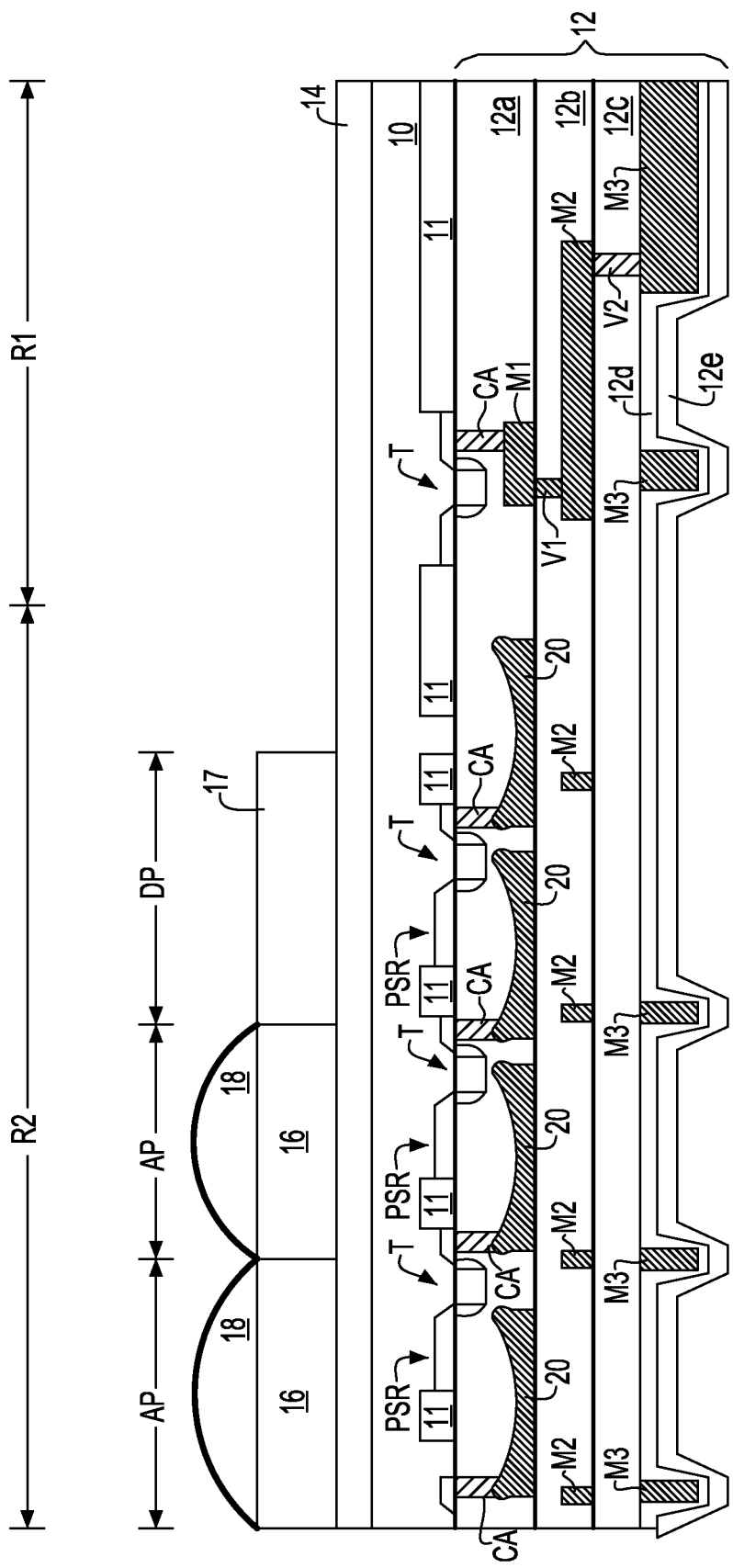
FIG. 1 shows a schematic cross-sectional diagram of a CMOS image sensor in accordance with a particular embodiment of the invention.

FIG. 1 shows a schematic cross-sectional diagram illustrating a CMOS image sensor in accordance with a particular embodiment of the invention. This particular embodiment of the invention comprises a first embodiment of the invention.

FIG. 1 shows a semiconductor substrate 10 that includes a circuitry portion R1 of the semiconductor substrate 10 that laterally adjoins and is adjacent a photosensitive portion R2 of the semiconductor substrate 10. Included within the photosensitive portion R2 of the semiconductor substrate 10 (as completely fabricated) is a plurality of active pixels AP, as well as a dark pixel DP. The semiconductor substrate 10 also includes a plurality of isolation regions 11 that separate a plurality of active regions of the semiconductor substrate 10. Included within the active regions within the photosensitive portion R2 of the semiconductor substrate 10, and separated by the isolation regions 11, is a plurality of transistors T, each one of which includes a photosensitive region PSR. An additional transistor T, absent an intended photosensitive region PSR, is located within the circuitry portion R1 of the semiconductor substrate 10.

FIG. 1 also shows a dielectric isolated metallization stack 12 located and formed upon a first side of the semiconductor substrate 10. The dielectric isolated metallization stack 12 includes sequentially laminated dielectric layers 12a, 12b, 12c, 12d and 12e. Also included within the dielectric isolated metallization stack 12 are conductor layers that include a plurality of contact vias CA, a first metal layer M1, a first via V1, a plurality of second metal layers M2, a second via V2 and a plurality of third metal layers M3. Also included within the dielectric isolated metallization stack 12 is a plurality of non-planar curved reflector layers 20. The non-planar curved reflector layers 20 are intended to be aligned within the active pixels AP and the dark pixel DP.

FIG. 1 also shows a spacer layer 14 located and formed upon a second side of the semiconductor substrate 10 opposite the first side of the semiconductor substrate 10 upon which is located and formed the dielectric isolated metallization stack 12. This second side of the semiconductor substrate (i.e., as completely assembled) comprises an incident radiation side of a CMOS image sensor in accordance with this first embodiment of the invention. FIG. 1 further also shows a plurality of color filter layers 16 located upon the spacer layer 14 and aligned with individual active pixels AP (i.e., with individual photosensitive regions PSR) within the plurality of active pixels AP. FIG. 1 further similarly also shows an opaque layer 17 also located upon the spacer layer 14 and laterally adjacent and adjoining a color filter layer 16. The opaque layer 17 is intended to align with the photosensitive region PSR within the dark pixel DP. FIG. 1 finally also shows a plurality of lens layers 18 located and formed upon the corresponding plurality of color filter layers 16 and also aligned with the photosensitive regions PSR within the active pixels AP.

With the exception of the reflector layers 20, each of the foregoing layers and structures that comprise the CMOS image sensor whose schematic cross-sectional diagram is illustrated in FIG. 1 may comprise materials, have dimensions and be formed using methods that are otherwise generally conventional in the optoelectronic fabrication art.

For example, the semiconductor substrate 10 may comprise any of several semiconductor materials. Non-limiting examples include silicon, germanium, silicon-germanium alloy, silicon-carbon alloy, silicon-germanium-carbon alloy and compound semiconductor materials. Non-limiting examples of compound semiconductor materials include gallium-arsenide semiconductor materials, indium-arsenide semiconductor materials and indium-phosphide semiconductor materials. Typically the semiconductor substrate 10 comprises a silicon or silicon-germanium alloy semiconductor material that has a thickness from about 5 to about 100 microns.

The plurality of isolation regions 11 may include, but is not necessarily limited to, local oxidation of silicon (LOCOS) isolation regions, shallow trench isolation regions (i.e., having a depth up to about 5000 angstroms) and deep trench isolation regions (i.e., having a greater depth up to about 20 microns). Typically, the instant embodiment uses shallow trench isolation regions that are located within shallow isolation trenches. The isolation regions 11 (whether located within shallow isolation trenches or deep isolation trenches) may comprise any of several dielectric materials. Typically included are oxides, nitrides and oxynitrides of silicon, as well as laminates thereof and composites thereof. Oxides, nitrides and oxynitrides of other elements are not excluded.

Typically, the plurality of isolation regions 11 is formed at least in part using a blanket layer deposition and planarizing method. Appropriate blanket layers may be formed using thermal or plasma oxidation or nitridation methods, chemical vapor deposition methods and physical vapor deposition methods. Planarization methods may include, but are not limited to mechanical planarizing methods, and chemical mechanical polish (CMP) planarizing methods. Chemical mechanical polish planarizing methods are most common.

Individual components of the transistors T will be discussed in further detail below, but nonetheless those individual components may also include, but are not necessarily limited to, conventional materials formed to conventional dimensions using conventional methods. Similarly, while FIG. 1 illustrates a CMOS image sensor in accordance with the instant particular first embodiment as using as a photosensitive region PSR one of a plurality of source and drain regions of a particular transistor T to thus provide a photodiode photosensitive region, the embodiment and the invention are not intended to be so limited. Rather the embodiment is intended to be operative within the context of a photosensitive region PSR within an active pixel AP that comprises other than a photodiode. Particular candidate photoactive devices other than photodiodes that may be used within the context of the embodiment and the invention may include, but are not necessarily limited to, charge coupled devices.

The individual vias and interconnection layers CA, M1, V1, M2, V2 and M3 that comprise the metallization components within the dielectric isolated metallization stack 12 may comprise any of several metallization materials that are conventional in the semiconductor fabrication art and the optoelectronic fabrication art. Non-limiting examples include certain metals, metal alloys, metal nitrides and metal silicides.

Most common are tungsten metallization materials, aluminum metallization materials and copper metallization materials, any one of which often includes a barrier metallization material. Types of metallization materials may differ as a function of size and location within the CMOS image sensor structure whose schematic cross-sectional diagram is illustrated in FIG. 1. Smaller dimensioned and lower-lying metallization features (i.e., located nearer to the semiconductor substrate 10) other than the contact vias CA typically comprise copper containing conductor materials. Instead, the contact vias CA typically comprise tungsten containing conductor materials. Larger and upper-lying metallization features are more likely to comprise aluminum containing conductor materials.

The plurality of dielectric layers 12a, 12b, 12c, 12d and 12e within the dielectric isolated metallization stack 12 may comprise any of several dielectric materials that are conventional in the optoelectronic fabrication art. Included are generally higher dielectric constant dielectric materials having a dielectric constant from 4 to about 20. Non-limiting examples that are included within this group are oxides, nitrides and oxynitrides of silicon. As a preferred option, the plurality of dielectric layers 12a, 12b, 12c, 12d and 12e may also comprise generally lower dielectric constant dielectric materials having a dielectric constant from about 2 to about 4. Included but not limiting within this group are hydrogels, aerogels, silsesquioxane spin-on-glass dielectric materials, fluorinated glass materials and organic polymer materials.

Typically, the dielectric isolated metallization stack 12 comprises interconnected metallization layers and discrete metallization layers comprising at least one of copper metallization materials and aluminum metallization materials. Within the dielectric isolated metallization stack 12, at least one of the dielectric layers 12a, 12b, 12c, 12d and 12e comprises a generally lower dielectric constant dielectric material as is disclosed above. Typically, the dielectric isolated metallization stack 12 has an overall thickness from about 1 to about 4 micrometers. The dielectric isolated metallization stack 12 may typically comprise from about 2 to about 4 discrete horizontal dielectric and metallization sub-component layers within the dielectric isolated metallization stack 12.

The spacer layer 14 comprises a material that is transparent to incoming radiation that is intended to be imaged using the CMOS image sensor whose schematic cross-sectional diagram is illustrated in FIG. 1. The passivation layer 14 also minimizes the interface state density on the backside of the semiconductor substrate 10. Since the CMOS image sensor whose schematic cross-sectional diagram is illustrated in FIG. 1 is understood as and characterized as a backside CMOS image sensor that requires that incident radiation pass through a part of the semiconductor substrate 10, the passivation layer 14 typically comprises a silicon oxide, or a bilayer of a silicon oxide (to passivate the semiconductor substrate 10) and a silicon nitride or a silicon oxynitride (for use as an anti-reflective coating material). Other materials are not excluded for the passivation layer 14. Typically, the passivation layer 14 has a thickness from about 100 to about 500 nanometers.

The color filter layers 16 will typically provide for some level of color discrimination within the limitations of the incoming radiation spectral range that is intended to be classified and imaged by the CMOS image sensor whose schematic cross-sectional diagram is illustrated in FIG. 1. Thus, individual color filter layers 16 within the plurality of color filter layers 16 will include different types and different levels of appropriate (i.e., generally infrared) dyes or pigments that provide appropriate color filter discrimination. The dyes or pigments may be dissolved in binders including but not limited to organic binders, inorganic binders and composites of organic binders and inorganic binders. Organic polymer binders, such as but not limited to organic polymer photoresist binders, are often common and desirable. Typically each of the color filter layers 16 has a thickness from about 200 to about 1000 nanometers.

In accordance with disclosure above, the opaque layer 17 is intended to provide a dark pixel DP within the CMOS image sensor whose schematic cross-sectional diagram is illustrated in FIG. 1. The presence of such a dark pixel DP is desirable within the CMOS image sensor whose schematic cross-sectional diagram is illustrated in FIG. 1 insofar as such a dark pixel DP provides for a background signal level absent classified incoming radiation within the CMOS image sensor. The opaque layer 17 is thus otherwise dimensioned similarly to the color filter layers 16, but with optionally a higher concentration of a broader spectrum dye or pigment to provide the dark pixel DP.

The lens layers 18 may comprise any of several optically transparent lens materials that are known in the optoelectronic fabrication art. Non-limiting examples include optically transparent inorganic materials, optically transparent organic materials and optically transparent composite materials. Most common are optically transparent organic materials. Typically the lens layers 18 are formed incident to patterning and reflow of an organic polymer material that has a glass transition temperature lower than the plurality of color filter layers 16. Other methods and materials may, however, be used for fabricating the lens layers 16.

The reflector layers 20 may comprise any of several reflective materials that are reflective to an incoming radiation wavelength range that the CMOS image sensor whose schematic cross-sectional diagram is illustrated in FIG. 1 is intended to classify and image. As is illustrated in FIG. 1, the reflector layers 20 are non-planar shaped, and typically curved, so that incoming radiation that is not initially captured by a particular photosensitive region PSR is reflected back into the particular photosensitive region PSR while minimizing optical cross-talk due to photosensing by adjacent photosensitive regions PSR within adjacent active pixels AP or dark pixels DP. As will be illustrated within the context of further disclosure below, the reflector layers 20 may be fabricated simultaneously with the first metallization interconnect layer Ml, although such a circumstance does not necessarily limit the embodiment. As is also illustrated within the schematic cross-sectional diagram of FIG. 1, the reflector layers 20 are connected through the contact vias CA to conductor regions within the transistors T. Thus, this particular embodiment provides an option that the reflector layers 20 may be electrically charged. Such a reflector layer 20 that is electrically charged provides the advantage of pinning an electrical potential at a surface of the photosensitive region PSR (i.e., photodiode), and thus may also eliminate the need for a doped pinning layer, and thereby reduce cost and provide more options within the context of design of the CMOS image sensor whose schematic cross-sectional diagram is illustrated in FIG. 1. Alternatively, a doped pinning layer (not shown) may be used to control a surface potential of the photodiode which comprises the photosensitive region PSR, within the CMOS image sensor whose schematic cross-sectional diagram is illustrated in FIG. 1.

FIG. 1 shows a schematic cross-sectional diagram of a CMOS image sensor in accordance with a first embodiment of the invention. The CMOS image sensor whose schematic cross-sectional diagram is illustrated in FIG. 1 functions as a backside CMOS image sensor that is typically used within the context of imaging incoming infrared radiation. The CMOS image sensor whose schematic cross-sectional diagram is illustrated in FIG. 1 realizes enhanced light capture efficiency by incorporating at or over a side of a photosensitive region PSR opposite an incoming radiation side of the photosensitive region PSR within each individual active pixel AP within the CMOS image sensor a non-planar, typically curved, reflector layer 20. Within this particular embodiment, the reflector layers 20 are fabricated as integral components with an M1 metallization layer within the dielectric isolated metallization stack 12. For that reason, the first embodiment provides that the reflector layers 20 may be electrically charged and biased. As discussed above, such an electrical charge within a reflector layer 20 may be desirable within the context of a reflector layer 20 for at least manufacturing design and efficiency reasons.

Figure 2:
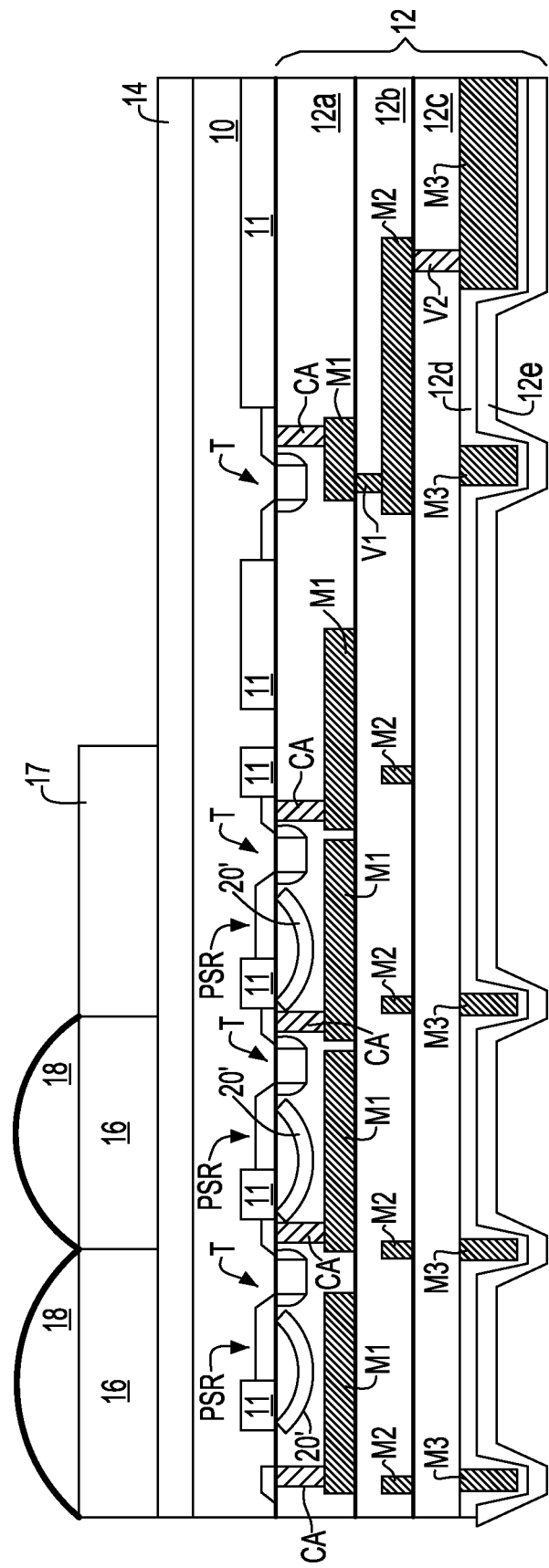
FIG. 2 shows a schematic cross-sectional diagram of a CMOS image sensor in accordance with another particular embodiment of the invention.

FIG. 2 shows a schematic cross-sectional diagram of a CMOS image sensor in accordance with another embodiment of the invention. The CMOS image sensor in accordance with this other embodiment of the invention comprises a CMOS image sensor in accordance with a second embodiment of the invention.

The CMOS image sensor whose schematic cross-sectional diagram is illustrated in FIG. 2 is in many respects otherwise analogous, equivalent or identical to the CMOS image sensor whose schematic cross-sectional diagram is illustrated in FIG. 1. Nonetheless, the CMOS image sensor whose schematic cross-sectional diagram is illustrated in FIG. 2 differs from the CMOS image sensor whose schematic cross-sectional diagram is illustrated in FIG. 1 by the presence of a reflector layer 20' that is independent from and dielectrically isolated from metallization structures within the dielectric layer 12a within the dielectric isolated metallization stack 12. Thus, in contrast with the CMOS image sensor whose schematic cross sectional diagram is illustrated in FIG. 1, the reflector layers 20' within the CMOS image sensor whose schematic cross-sectional diagram is illustrated in FIG. 2 are fabricated independently of other metallization components within the dielectric isolated metallization stack 12. For this reason also, the reflector layers 20' within the CMOS image sensor whose schematic cross-sectional diagram is illustrated in FIG. 2 are typically not independently electrically charged.

Although not specifically illustrated within the schematic cross-sectional diagram of FIG. 1 or FIG. 2, the CMOS image sensor in accordance with the first embodiment as illustrated in FIG. 1 or the CMOS image sensor in accordance with the second embodiment as illustrated in FIG. 2 is generally fabricated starting with the semiconductor substrate 10 that includes the transistors T. The dielectric isolated metallization stack 12 is then fabricated using successive dielectric layer layering and successive metallization layer layering upon the first side of the semiconductor substrate 10 that includes the transistors T and the isolation regions 11. Finally, the spacer layer 14, color filter layers 16, opaque layer 17 and lens layers 18 are sequentially fabricated upon the second side of the semiconductor substrate 10 opposite the first side of the semiconductor substrate 10.

Figure 3:
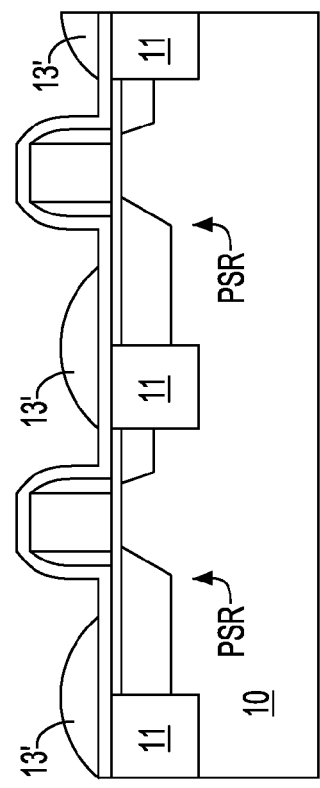
FIG. 3 to FIG. 5 show a series of schematic cross-sectional diagrams illustrating the results of progressive stages in fabricating a plurality of reflector layers within a CMOS image sensor in accordance with a particular methodological embodiment of the invention.
Figure 4:
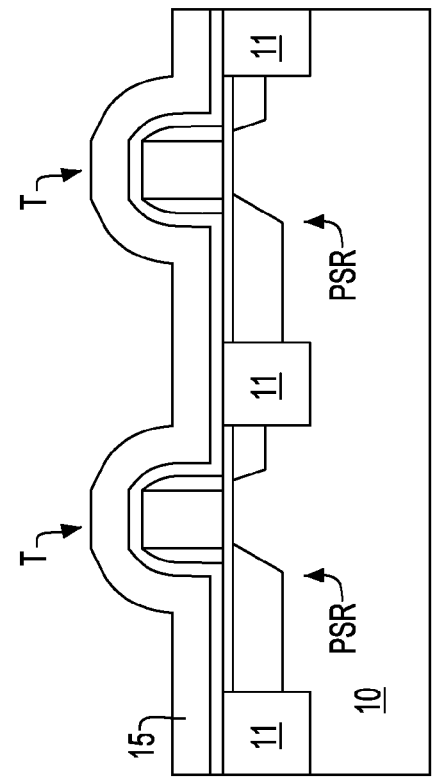
Figure 5:
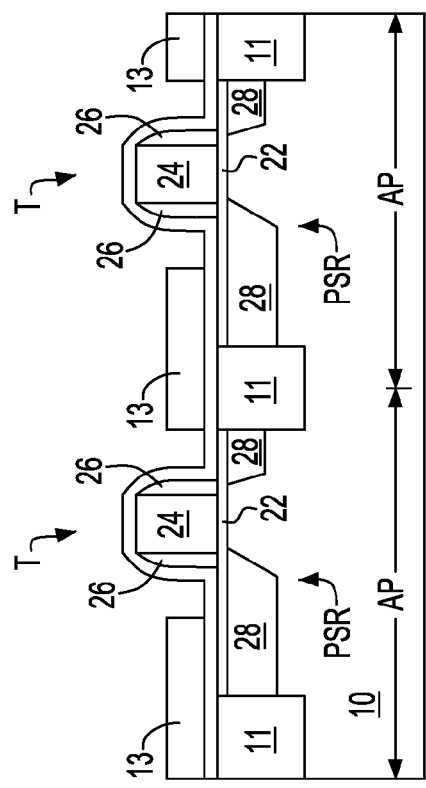

FIG. 3 to FIG. 5 show a series of schematic cross-sectional diagrams illustrating the results of progressive stages in fabricating a plurality of reflector layers 20' within a plurality of active pixels AP within the CMOS image sensor whose schematic cross-sectional diagram is illustrated in FIG. 2. To that end, the schematic cross-sectional diagrams of FIG. 3 to FIG. 5 illustrate a portion of the CMOS image sensor whose schematic cross-sectional diagram is illustrated in FIG. 2, at an early stage in the fabrication thereof in accordance with the second embodiment.

FIG. 3 shows the semiconductor substrate 10 including the isolation regions 11 that separate a plurality of active regions within the semiconductor substrate 10. Also illustrated within the schematic cross-sectional diagram of FIG. 3 within the plurality of active regions is a plurality of transistors T. Each of the individual transistors T within the plurality of transistors T includes a gate dielectric 22 located upon an active region of the semiconductor substrate 10. Each of the individual transistors T also includes a gate electrode 24 located upon the gate dielectric 22. Each of the individual transistors T also includes a spacer 26 located adjacent and adjoining sidewalls of the gate electrode 24. While FIG. 3 illustrates the spacer 26 as a plurality of layers, the spacer 26 is nonetheless intended as a single layer encircling a particular gate electrode 24 in plan-view. Finally, each of the transistors T includes a plurality of source and drain regions 28 located and formed within a particular active region at locations not covered by a particular gate electrode 24. Within FIG. 3, one of the source and drain regions 28 within each of the transistors T serves as a photosensitive region PSR that comprises a photodiode.

Each of the foregoing layers and structures that are included within each of the transistors T may comprise materials, have dimensions and be formed using methods that are otherwise generally conventional in the semiconductor fabrication art, and also in the optoelectronic fabrication art.

The gate dielectrics 22 may comprise any of several gate dielectric materials. Included but not limiting are generally lower dielectric constant gate dielectric materials such as but not limited to oxides, nitrides and oxynitrides of silicon having a dielectric constant from about 4 to about 20, measured in vacuum. Also included, and also not limiting, are generally higher dielectric constant gate dielectric materials having a dielectric constant from about 20 to at least about 100. These higher dielectric constant gate dielectric materials may include, but are not limited to hafnium oxides, hafnium silicates, titanium oxides, barium-strontium titanates (BSTs) and lead-zirconate titanates (PZTs).

The foregoing gate dielectric materials may be formed using methods appropriate to their materials of composition. Non-limiting examples of methods include thermal or plasma oxidation or nitridation methods, chemical vapor deposition methods (including atomic layer chemical vapor deposition methods) and physical vapor deposition methods. Typically, the gate dielectrics 22 comprise a thermal silicon oxide gate dielectric material having a thickness from about 2 to about 7 nanometers.

The gate electrodes 24 may similarly also comprise any of several gate electrode conductor materials. Non-limiting examples include certain metals, metal alloys, metal silicides and metal nitrides, as well as doped polysilicon materials (i.e., having a dopant concentration from about 1e18 to about 1e22 dopant atoms per cubic centimeter) and polycide (i.e., doped polysilicon/metal silicide stack) materials. The gate electrode materials may be deposited using any of several methods. Non-limiting examples include chemical vapor deposition methods (also including atomic layer chemical vapor deposition methods) and physical vapor deposition methods. Typically, each of the gate electrodes 24 comprises a doped polysilicon material having a thickness from about 1000 to about 1500 angstroms.

The spacers 26 are typically formed of a dielectric spacer material or a laminate of dielectric spacer materials, although spacer layers formed of conductor materials are also known.

Oxides, nitrides and oxynitrides of silicon are commonly used as dielectric spacer materials. Oxides, nitrides and oxynitrides of other elements are not excluded. The dielectric spacer materials may be deposited using methods analogous, equivalent or identical to the methods used for forming the gate dielectrics 22. Typically, the spacers 26 are formed using a blanket layer deposition and etchback method that provides the spacers 26 with the characteristic inward pointed shape.

Finally, the source and drain regions 28 are typically formed using a two-step ion implantation method. The source and drain regions 28 are implanted at a polarity (i.e., conductivity type) appropriate to a field effect transistor T within which they are formed. The two-step ion implantation method uses the gate electrode 24, with and without the spacer 26, as a mask. Typical concentrations of dopants within the source and drain regions 22 is from about 1e15 to about 1e22 dopant atoms per cubic centimeter.

Finally, FIG. 3 also shows a plurality of reflowable material layers 13 located interposed between the gate electrodes 24 within the plurality of transistors T. The reflowable material layers 13 may comprise any of several reflowable materials. Non-limiting examples include organic reflowable materials, inorganic reflowable materials and composites of organic reflowable materials and inorganic reflowable materials. Typically each of the reflowable material layers 13 comprises an inorganic glass reflowable material, such as but not limited to a silicate glass reflowable material or a doped (i.e., boron, phosphorus or boron and phosphorus) silicate glass reflowable material that has a thickness from about 500 to about 150 nanometers and a linewidth from about 0.5 to about 50 microns. Within the context of various desirable pixel sizes, the dimension of the reflowable material layers 13 will approximate the dimensions of the photosensitive regions PSR. In addition to the foregoing dimensional requirements, the plurality of reflowable material layers 13 also comprises a reflowable material that is at least substantially transparent (i.e., greater than about 75% transmittance) with respect to a wavelength range that the CMOS image sensor whose schematic cross-sectional diagram is illustrated in FIG. 3 to FIG. 5 is intended to classify and image.

FIG. 4 shows a plurality of reflowed material layers 13' that results from thermal reflow processing of the CMOS image sensor whose schematic cross-sectional diagram is illustrated in FIG. 3. When the reflowable material layers 13 that are illustrated in FIG. 3 comprise, for example, an inorganic glass reflowable material, such as but not limited to a doped silicate glass inorganic glass reflowable material, a thermal annealing processing temperature from about 200 to about 800 degrees centigrade for a thermal annealing time period from about 5 to about 600 seconds may conveniently be used for forming the reflowed material layers 13' that are illustrated in FIG. 4 from the reflowable material layers 13 that are illustrated in FIG. 3. As illustrated in FIG. 4, the reflowed material layers 13' have a convex upper surface that may be part of a semi-hemispherical shape.

FIG. 5 shows a plurality of reflector layers 20' located and formed upon the plurality of reflowed material layers 13'. The plurality of reflector layers 20' is typically formed using a sequential blanket reflector material layer deposition, masking and etching process. As discussed above, each of the reflector layers 20' typically comprises an aluminum reflector material or a copper reflector material that has a thickness from about 50 to about 500 nanometers. Each of the plurality of reflector layers 20' conforms to a particular reflowed layer 13' and also has a convex upper surface that may be part of a semi-hemispherical shape.

Further fabrication of the CMOS image sensor whose schematic cross-sectional diagram is illustrated in FIG. 5 to provide the CMOS image sensor structure whose schematic cross-sectional diagram is illustrated in FIG. 2 includes deposition of the dielectric layer 12a, that is intended to incorporate the reflowed material layers 13'.

FIG. 6 to FIG. 9 show a series of schematic cross-sectional diagrams illustrating the results of progressive stages in fabricating the reflector layers 20' within the CMOS image sensor whose schematic cross-sectional diagram is illustrated in FIG. 2 in accordance with an alternative methodological embodiment of the invention. This alternative methodological embodiment of the invention comprises a second methodological embodiment of the invention.

Figure 6:
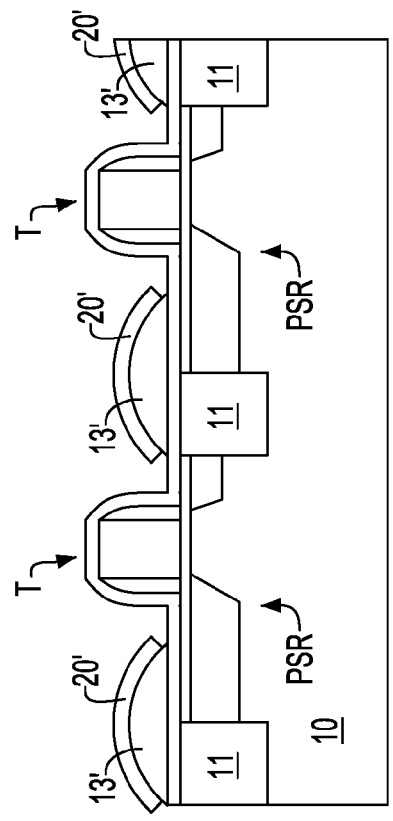
FIG. 6 to FIG. 9 show a series of schematic cross-sectional diagrams illustrating the results of progressive stages in fabricating a plurality of reflector layers within a CMOS image sensor in accordance with another particular methodological embodiment of the invention.

FIG. 6 shows a schematic cross-sectional diagram of a CMOS image sensor largely analogous with the CMOS image sensor whose schematic cross-sectional diagram is illustrated in FIG. 3, but in a first instance absent the reflowable material layers 13. In a second instance, also present within the CMOS image sensor whose schematic cross-sectional diagram is illustrated in FIG. 6 is a transparent liner layer 15. The transparent liner layer 15 may comprise materials that are analogous, equivalent or identical to the reflowable material layers 13 that are illustrated in FIG. 3. Alternatively, the transparent liner layer 15 may also comprise a non-reflowable material, as long as the non-reflowable material is also at least substantially transparent to a wavelength of light desired to be classified and imaged using the CMOS image sensor whose schematic cross-sectional diagram is illustrated in FIG. 6 to FIG. 9.

Figure 7:
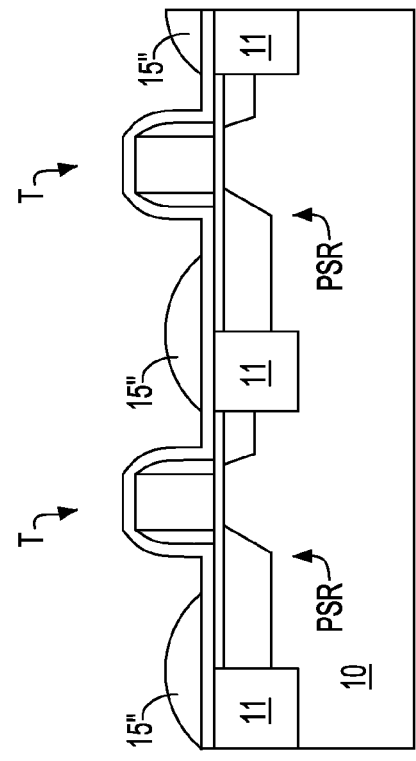

FIG. 7 shows a plurality of transparent liner layers 15' that derive from patterning of the transparent liner layer 15 that is illustrated in FIG. 6. Such patterning may be effected using methods and materials that are otherwise generally conventional in the optoelectronic fabrication art. Such methods will typically use a resist layer (i.e., a photoresist layer) that is first used as an etch mask for forming the transparent liner layers 15' from the transparent liner layer 15. That resist layer is then reflowed to form the plurality of resist layers 22 that is illustrated within the CMOS image sensor whose schematic cross-sectional diagram is illustrated in FIG. 7.

Figure 8:
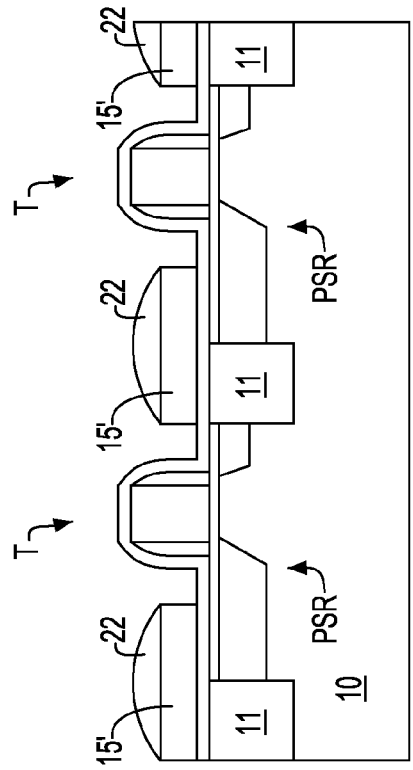

FIG. 8 shows a plurality of transparent liner layers 15" nominally aligned with the photosensitive regions PSR within the transistors T within the CMOS image sensor whose schematic cross-sectional diagram is illustrated in FIG. 8. The transparent liner layers 15" include a convex shape. The convex shape derives from a non-selective sequential etching of the resist layers 22 and the transparent liner layers 15' that are illustrated in FIG. 7. The foregoing non-selective sequential etching typically comprises an anisotropic etching, although this particular methodological embodiment of the invention is not necessarily so limited. Thus, the liner layers 15" that are illustrated within the CMOS image sensor of FIG. 8 are intended as having a similar convex geometric shape in comparison with the reflowable material layers 13' that are illustrated within the CMOS image sensor of FIG. 4.

Figure 9:
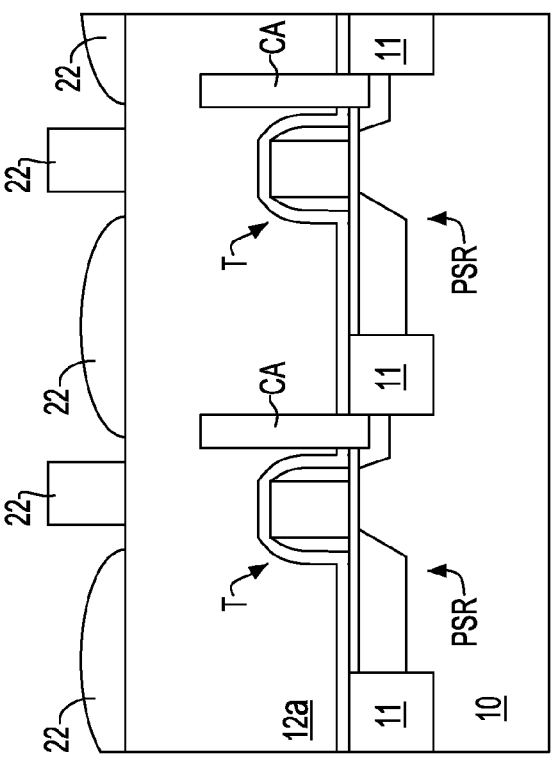

Finally, FIG. 9 shows the reflector layers 20' located and formed upon the transparent liner layers 15". The reflector layers 20' that are illustrated within the schematic cross-sectional diagram of FIG. 9 may comprise materials, have dimensions and be formed using methods that are analogous, equivalent or identical to the materials, dimensions and methods used within the context of the reflector layers 22' that are illustrated within the CMOS image sensor of FIG. 5.

Similarly with the CMOS image sensor whose schematic cross-sectional diagrams are illustrated in FIG. 3 to FIG. 5, the CMOS image sensor whose schematic cross-sectional diagrams are illustrated in FIG. 6 to FIG. 9 is further fabricated within the context of deposition of the dielectric layer 12a as is illustrated in FIG. 2, which similarly with the CMOS image sensor whose schematic cross-sectional diagram is illustrated in FIG. 5 incorporates the transparent liner layers 15".

Figure 10:
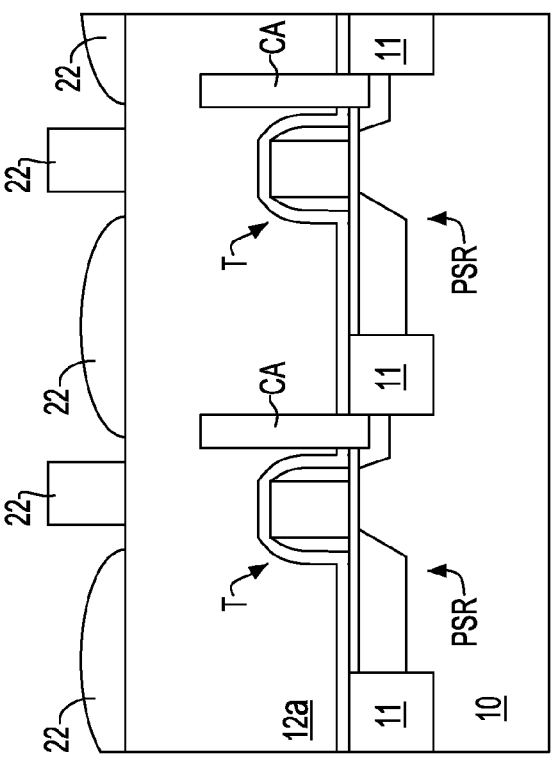
FIG. 10 to FIG. 12 show a series of schematic cross-sectional diagram illustrating the results of progressive stages in fabricating a plurality of reflector layers within a CMOS image sensor in accordance with yet another particular methodological embodiment of the invention.
Figure 11:
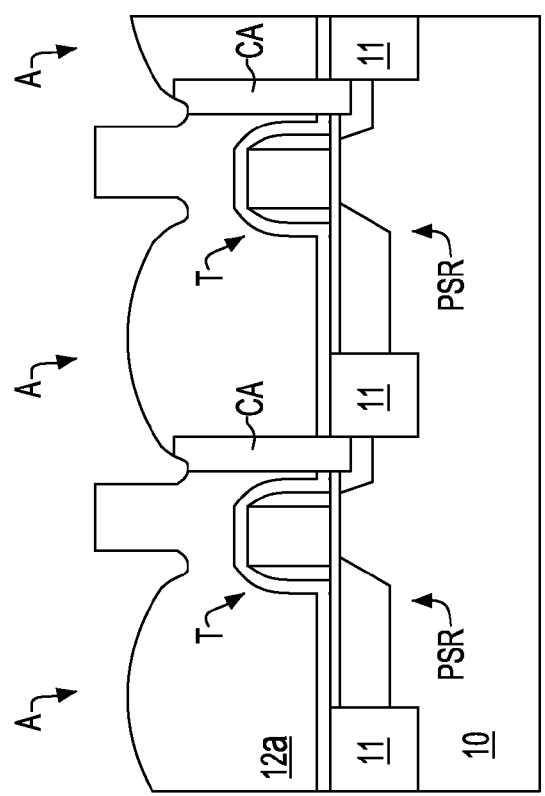
Figure 12:
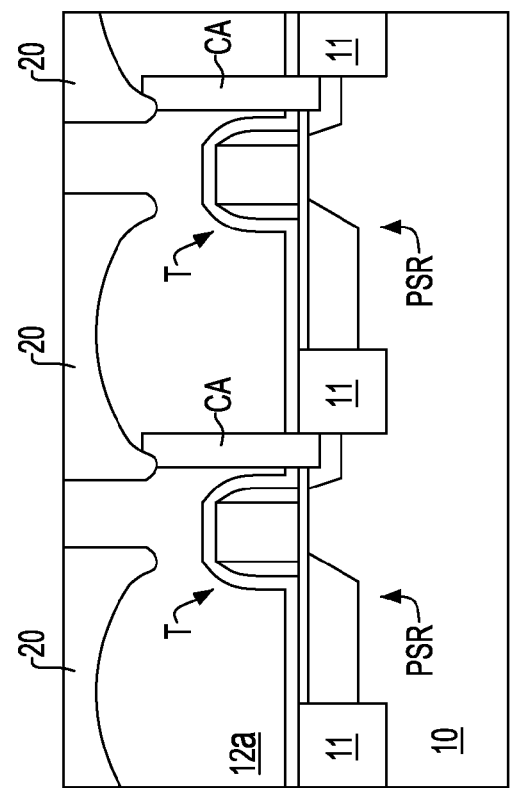

FIG. 10 to FIG. 12 show a series of schematic cross-sectional diagrams illustrating the results of progressive stages in fabricating the plurality of reflector layers 20 within the CMOS image sensor whose schematic cross-sectional diagram is illustrated in FIG. 1. The schematic cross-sectional diagrams of FIG. 10 to FIG. 12 thus show several intermediate process steps in fabrication of a portion of the CMOS image sensor whose schematic cross-sectional diagram is illustrated in FIG. 1.

FIG. 10 in a first instance shows a CMOS image sensor similar to the CMOS image sensor whose schematic cross-sectional diagram is illustrated in FIG. 3 or FIG. 6, but absent the reflowable material layers 13 that are illustrated in FIG. 3, or absent the transparent liner layer 15 that is illustrated in FIG. 6. FIG. 10 also shows the dielectric layer 12a that is illustrated in FIG. 1, as well as the contact vias CA that are illustrated in FIG. 1. FIG. 10 also shows a resist layer 22' located and formed upon the dielectric layer 12a. The resist layer 22' includes both a plurality of convex shorter step height features and a plurality of rectangular higher step height features. The plurality of convex shorter step height features derives from exposure while using a portion of a mask that includes a half tone feature (i.e., thus providing a partially exposed resist layer that may be subsequently developed), while the rectangular higher step height features derive from a complete exposure or a complete lack of exposure of the resist layer, depending upon whether a resist material that comprises the resist layer comprises a positive resist material or a negative resist material.

FIG. 11 shows the results of etching the CMOS image sensor whose schematic cross-sectional diagram is illustrated in FIG. 10, while using resist layer 22' as a mask. As is illustrated in FIG. 11, the foregoing etching is preferably undertaken non-selectively to replicate the surface topography of the resist layer 22' into the dielectric layer 12a and thereby form a plurality of apertures A.

FIG. 12 shows the reflector layers 20 located and formed into the apertures A that are illustrated within the CMOS image sensor of FIG. 11. The reflector layers 20 are typically formed using a blanket reflector material layer (i.e., conductor material layer) deposition and planarizing method that in turn uses upper lying portions of the dielectric layer 12a as a planarizing stop layer. Non-limiting examples of planarizing methods include mechanical planarizing methods and chemical mechanical polish planarizing methods. Chemical mechanical polish planarizing methods are generally more common.

FIG. 1 and FIG. 2 in particular show a plurality of CMOS image sensor structures in accordance with particular embodiments of the invention. The individual CMOS image sensor structures include a reflector layer 20 (FIG. 1) or a reflector layer 20' (FIG. 2) that reflects incident radiation that was not initially captured by a photosensitive region PSR, such as a photodiode region, back into the photosensitive region PSR. Within the embodiments, such a reflector layer 20 or 20' is non-planar, and generally curved shaped, so as to reflect incident radiation back to a particular photosensitive region PSR while minimizing or eliminating optical cross-talk with respect to an adjacent photosensitive region PSR.

While the foregoing desirable structural and performance characteristics of the embodiments are illustrated within the context of a backside CMOS image sensor that is typically used for sensing infrared radiation, neither the embodiments nor the invention is necessarily intended to be so limited. Rather, and in particular with respect to Mouli, as cited within the Description of the Related Art, all of which related art is incorporated herein by reference, the embodiments and the invention also contemplate that a solid state image sensor, such as but not limited to a CMOS image sensor, that includes a non-planar curved reflector in accordance with the embodiments and the invention may alternatively fabricated as a frontside image sensor. Under such circumstances, the non-planar reflector layer is typically included within a cavity within a semiconductor substrate.

Figure 13:
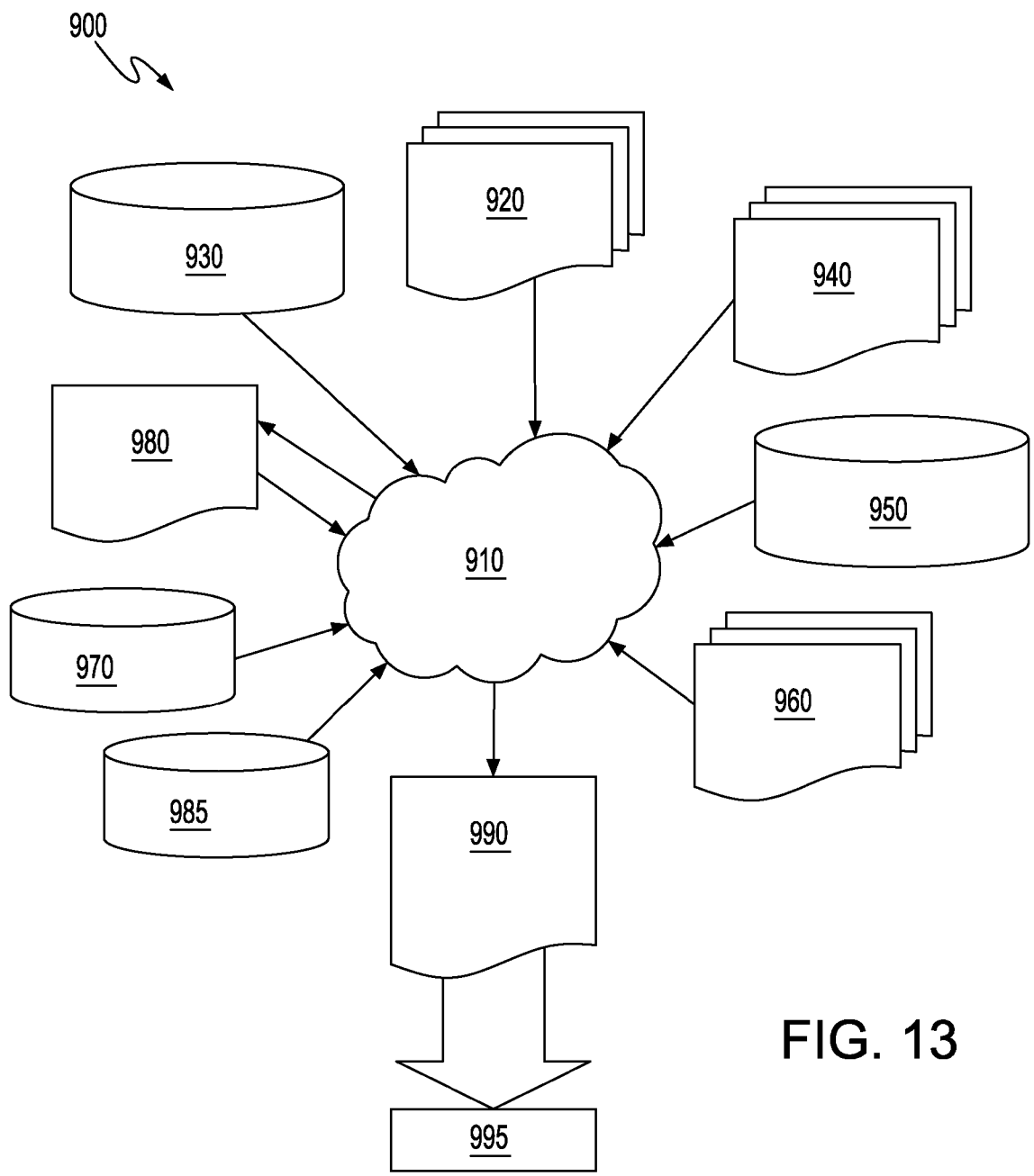
FIG. 13 shows a flow diagram of a design process that may be used in designing, manufacturing and/or testing an image sensor structure in accordance with the invention.

FIG. 13 shows a block diagram of an exemplary design flow 900 used for example, in semiconductor design, manufacturing, and/or test. Design flow 900 may vary depending on the type of IC being designed. For example, a design flow 900 for building an application specific IC (ASIC) may differ from a design flow 900 for designing a standard component. Design structure 920 is preferably an input to a design process 910 and may come from an IP provider, a core developer, or other design company or may be generated by the operator of the design flow, or from other sources. Design structure 920 comprises an embodiment of the invention as shown in FIG. 1 or FIG. 2 in the form of schematics or HDL, a hardware-description language (e.g., Verilog, VHDL, C, etc.). Design structure 920 may be contained on one or more machine readable medium. For example, design structure 920 may be a text file or a graphical representation of an embodiment of the invention as shown in FIG. 1 or FIG. 2. Design process 910 preferably synthesizes (or translates) an embodiment of the invention as shown in FIG. 1 or FIG. 2 into a netlist 980, where netlist 980 is, for example, a list of wires, transistors, logic gates, control circuits, I/O, models, etc. that describes the connections to other elements and circuits in an integrated circuit design and recorded on at least one of machine readable medium. This may be an iterative process in which netlist 980 is resynthesized one or more times depending on design specifications and parameters for the circuit.

Design process 910 may include using a variety of inputs; for example, inputs from library elements 930 which may house a set of commonly used elements, circuits, and devices, including models, layouts, and symbolic representations, for a given manufacturing technology (e.g., different technology nodes, 32 nm, 45 nm, 90 nm, etc.), design specifications 940, characterization data 950, verification data 960, design rules 970, and test data files 985 (which may include test patterns and other testing information). Design process 910 may further include, for example, standard circuit design processes such as timing analysis, verification, design rule checking, place and route operations, etc. One of ordinary skill in the art of integrated circuit design can appreciate the extent of possible electronic design automation tools and applications used in design process 910 without deviating from the scope and spirit of the invention. The design structure of the invention is not limited to any specific design flow.

Design process 910 preferably translates an embodiment of the invention as shown in FIG. 1 or FIG. 2, along with any additional integrated circuit design or data (if applicable), into a second design structure 990. Design structure 990 resides on a storage medium in a data format used for the exchange of layout data of integrated circuits and/or symbolic data format (e.g. information stored in a GDSII (GDS2), GL1, OASIS, map files, or any other suitable format for storing such design structures). Design structure 990 may comprise information such as, for example, symbolic data, map files, test data files, design content files, manufacturing data, layout parameters, wires, levels of metal, vias, shapes, data for routing through the manufacturing line, and any other data required by a semiconductor manufacturer to produce an embodiment of the invention as shown in FIG. 1 or FIG. 2. Design structure 990 may then proceed to a stage 995 where, for example, design structure 990: proceeds to tape-out, is released to manufacturing, is released to a mask house, is sent to another design house, is sent back to the customer, etc.

The preferred embodiments of the invention are illustrative of the invention rather than limiting of the invention. Revisions and modifications may be made to methods, materials, structures and dimensions of a CMOS image sensor in accordance with the preferred embodiments, while still providing an image sensor and a method for fabricating the image sensor in accordance with the invention, further in accordance with the accompanying claims.

What is claimed is:

1. A method for fabricating an image sensor comprising:
   providing a substrate including a photosensitive region, wherein the photosensitive region includes at least one transistor;
   forming over a side of the photosensitive region opposite an incoming radiation side of the photosensitive region a non-planar reflector layer shaped and positioned to reflect uncaptured incident radiation back into the photosensitive region; and
   forming conductive vias extending from the non-planar reflector layer to a conductive region of the at least one transistor in the photosensitive region, wherein said non-planar reflector layer is electrically charged to pin an electrical potential at a surface of the photosensitive region.

2. The method of claim 1 wherein the non-planar reflector layer is curved.

3. The method of claim 1 wherein the non-planar reflector layer is also shaped and positioned to reflect uncaptured incident radiation back into the photosensitive region while avoiding reflection of the uncaptured incident radiation back into an additional photosensitive region laterally separated from the photosensitive region within the substrate.

4. The method of claim 1 wherein the providing the substrate includes providing a semiconductor substrate including a photodiode photosensitive region.

5. The method of claim 1 wherein the forming the non-planar reflector layer includes forming the non-planar reflector layer within a dielectric isolated metallization stack also formed over the side of the photosensitive region opposite the incoming radiation side of the photosensitive region.

6. The method of claim 5 wherein the non-planar reflector layer is formed simultaneously with a metallization layer within the dielectric isolated metallization stack.

7. The method of claim 5 wherein the non-planar reflector layer is not formed simultaneously with a metallization layer within the dielectric isolated metallization stack.

8. The method of claim 1 further comprising forming over the incident radiation side of the photosensitive region a color filter layer aligned with the photosensitive region.

9. The method of claim 8 further comprising forming over the incident radiation side of the photosensitive region a lens layer aligned with the color filter layer and the photosensitive region.

10. The method of claim 1, wherein forming the non-planar reflector layer comprises:
    forming a reflowable material over said side of the photosensitive region opposite said incoming radiation side of the photosensitive region;
    thermal reflow processing the reflowable material to form a convex upper surface on the reflowable material; and
    depositing a metal layer on the convex upper surface of the reflowable material.

11. The method of claim 10, wherein the reflowable material comprises silicate glass, doped silicate glass or a combination thereof.

12. The method of claim 10, wherein the thermal reflow processing comprises thermal annealing.

13. The method of claim 10, wherein the metal layer comprises aluminum, copper or a combination thereof.

* * * * *